United States Patent [19]

Birnbaum et al.

[11] Patent Number: 4,675,847
[45] Date of Patent: Jun. 23, 1987

[54] CCD RECIRCULATION DATA FLOW ARRANGEMENT

[75] Inventors: Jack Birnbaum, East Windsor, N.J.; Donald R. Lampe, Ellicott City, Md.

[73] Assignee: The United States of America as represented by the Secretary of the Air Force, Washington, D.C.

[21] Appl. No.: 749,352

[22] Filed: Jun. 27, 1985

[51] Int. Cl.$^4$ ............................................. G11C 11/34
[52] U.S. Cl. .................... 365/183; 365/222; 377/63
[58] Field of Search .............. 365/238, 183, 222, 219; 377/62, 63, 58, 61

[56] References Cited

U.S. PATENT DOCUMENTS

| | | | |
|---|---|---|---|
| 3,914,748 | 10/1975 | Barton et al. | 365/45 |
| 4,165,541 | 8/1979 | Varshney et al. | 365/219 |
| 4,206,370 | 6/1980 | Leach, Jr. | 377/63 |
| 4,225,947 | 9/1980 | Councill et al. | 365/238 |
| 4,376,897 | 3/1983 | Byrne et al. | 377/63 |

OTHER PUBLICATIONS

L. M. Terman et al., "CCD Memory Using Multilevel Storage", 1981 IEEE International Solid-State Circuits Conference, Digest of Technical Papers, Feb. 19, 1981, pp. 154-155.

Primary Examiner—Joseph A. Popek
Attorney, Agent, or Firm—Gerald B. Hollins; Donald J. Singer

[57] ABSTRACT

A dynamic closed-loop circulating analog memory, preferably embodied with monolithic charge coupled devices and employing a minimum number of serial data transfers, additive refresh signal processing, and dark current subtraction for limiting crosstalk degradation of the circulated signals.

9 Claims, 19 Drawing Figures

Fig. 1

SEQUENTIAL "SNAP-SHOTS" OF POTENTIAL WELLS & CHARGE PACKETS DURING OPERATION

Fig. 2B

CLOCKING WAVEFORMS WITH DATA FLOW SUPERIMPOSED

INPUT SAMPLER & SERIAL PUSH/PULL GENERATION FOR AN OFF-CHIP INPUT

Fig. 4A

THERMAL LEAKAGE CANCELLATION AT EACH RECIRCULATION

Fig. 4B

SERIAL PUSH/PULL WAVEFORMS

CCD RECIRCULATION DATA FLOW ARRANGEMENT

RIGHTS OF THE GOVERNMENT

The invention described herein may be manufactured and used by or for the Government of the United States for all governmental purposes without the payment of any royalty.

BACKGROUND OF THE INVENTION

This invention relates to the field of charge coupled device memories used for the temporary storage and repeated accessing of analog data.

In the processing of weak signals received from a low-level energy source such as a radio frequency or optical radiator there is need for small size relatively low cost temporary storage of analog signal data and for repeated accessing of this data. This storage and repeated accessing allow, for example, cancellation of random noise signal components and reinforcing-addition enhancement of the desired signal components. One technique for accomplishing this type of storage involves charge transfer devices of the bucket brigade or charge coupled device (CCD) type, the CCD is, for example, particularly attractive for storage used in the canonic recursive filters employed in radar signal processing. Signal processing arrangements of this type are identified as post-detection integration processors. CCD storage is also useful in embodying signal filters.

One arrangement for achieving CCD storage of such signal information would be, of course, to provide a long serial register and to fill this register with analog values representing received signals during a sample interval. In circulating analog signal values around a long serial CCD register at high clocking rates and for numerous recirculation times, however, a problem of signal degradation is found to exist. In a CCD memory this signal degradation is to a large degree attributable to charge transfer inefficiency, a lack of complete charge transfer between the wells comprising individual CCD storage locations. Following a number of transfer events between CCD wells an original signal is therefore found to be diminished in signal-to-noise ratio and eventually subject to becoming lost.

Several techniques have been developed for maintaining the integrity of a signal circulated around a charge coupled device closed-loop memory array, one of these techniques, the additive refresh concept was proposed in the paper "Low Loss CCD Concept" presented by the Fifth International Conference on CCDs, Edinburgh Scotland, Sept 1979, pp. 432–437, by W. F. Kosonocky and D. J. Sauer and is employed in the present invention apparatus. The contents of the Kosonocky and Sauer paper are hereby incorporated by reference into the present specification. In addition to additive refresh signal maintenance it is also found desirable in a CCD circulating memory array to minimize the number of serial transfers of data between CCD wells since serial transfers, especially at high speed, are a major source of signal degradation. A reduction in the number of serial transfers occurring therefore reduces the amount of signal degradation and the corresponding signal enhancement that is required in a particular CCD system.

The classic approach to limiting the number of serial transfers required in a memory of given size involves use of a combination of serial operated and parallel operated memory stages in an apparatus which has become known as a serial-parallel-serial (SPS) memory. In such memories, data may be received from a serially-operating input, assembled in a register and then transferred out of the assembly register in parallel form for propagation through a succession or stack of slower operating parallel stages. The final register in the parallel stack is also capable of serial operation and is employed in such serial operation to place the parallel propagated memory data once again in serial form. An SPS memory is commonly referred to dimensionally as having M parallel columns of N vertically stacked stages. In this arrangement the total number of storage sites is (M·N), however, in achieving a delay of length M·N, the data need transfer only through M+N stages. The greatest saving in number of signal transfers in an SPS memory occurs for square arrays (M=N), however, other factors such as clock drive considerations enter into an array configuration tradeoff.

An SPS organized memory offers another benefit relating to sample-to-sample isolation. This benefit can be appreciated by realizing that the data behind a particular signal sample is a second sample during signal storage in the fast horizontal register of an SPS combination, but is a completely different third signal sample during transit through the slow SPS column registers. Thus, in contrast to a purely serial memory, crosstalk in an SPS memory is split between two different sets of signal samples. Each signal sample therefore receives less crosstalk in an SPS memory than would be the case in a purely serial memory of the same size. As the number of cells in each direction of an SPS memory is varied, of course, the crosstalk for each of the signals varies in response to the number of charge transfers in each direction and the effective charge transfer efficiency for each such transfer.

SPS memory arrangements are known in the patent art, as is illustrated by the patent of Ramesh C. Varshney et al, U.S. Pat. No. 4,165,541, which discloses a serial-parallel-serial charge coupled device memory of the bi-directional type wherein each serial section is both an input register and an output register and wherein serial streams of charge packets flow simultaneously in opposite directions in the parallel section. In the Varshney patent, odd data bits of a serial input stream flow into a first serial register, through a parallel section in a first direction, and then out of the second serial register, while concurrently even data bits flow into the second serial register, then through the parallel section in the opposite or second direction and thence out of the first serial register. This arrangement provides a substantially increased data transfer rate and is identified as an interlace and ripple clock arrangement. The Varshney patent also includes an informative discussion of prior art attending charge coupled device SPS memories.

Another example of SPS CCD memories is found in the patent of James B. Barton, U.S. Pat. No. 3,914,748, which concerns a CCD analog array arranged to minimize dispersion and crosstalk problems through the use of isolation element charge packets and also through the use of a multiplexed pair of shift registers.

An example of serial-parallel-loop charge coupled device circuitry is found in the patent of George S. Leach, Jr., U.S. Pat. No. 4,206,370, which discloses a CCD register apparatus employing loops of conductor material formed in an integrated circuit chip for the purpose of coupling signal between CCD cells and also employing different clock phases for CCD cells located in each loop.

Another SPS CCD apparatus is shown in the patent of John J. Byrne, U.S. Pat. No. 4,376,897, which discloses an unusual arrangement for transferring data between the last parallel shift register in a stack and the serial output register without requiring use of the mid-level fixed voltage required previously.

Another example of a serial-parallel-serial shift register arrangement is shown in the patent of Edwin B. Councill, U.S. Pat. No. 4,225,947, which concerns a serial-parallel-serial storage array having the capability of line accessing data in the parallel storage registers for improved speed of data accessing and other advantages. The Councill apparatus also contemplates possible recirculation of the output from a single serial-parallel-serial memory array back to its input for continuous data retention.

SUMMARY OF THE INVENTION

An object of the present invention is to provide a charge coupled device circulating memory which minimizes the serial propagation of circulated signals in order to limit crosstalk and other CCD signal degradation mechanisms.

Another object of the invention is to provide a CCD memory loop arrangement involving a minimum number of effective delay stages.

Another object of the invention is to provide a CCD loop memory arrangement wherein the number of effective delay stages is minimized through the combined use of first-to-last and last-to-first data organization.

Another object of the invention is to provide a closed-loop CCD memory storage arrangement which includes plural signal enhancement and signal readout arrangements within the signal circulation loop.

These objects are achieved by providing a charge coupled device memory apparatus for circulating the time segregated serial signal increments from an analog input signal stream interval around a closed memory loop which includes first serial-parallel-serial charge coupled device array having a first serial input register, a first serial output register, and first register stack means for receiving time segregated signal increments in parallel form from the first serial input register, propagating the increments in parallel form between successive parallel stages in the first stack means and conveying the increments in parallel form to the first serial output register. The apparatus also includes a second serial-parallel-serial charge coupled device array including a second serial input register, a second serial output register, and a second register stack means together with first and second serial transmission means coupled between output and input terminals of the serial input and output registers for coupling serial data between the first and second stacks.

BRIEF DESCRIPTION OF THE DRAWINGS

FIG. 2, comprising

FIG. 3, comprising

FIG. 4, comprising

FIG. 9, comprisng FIGS. 9A to 9C, shows physical layout, potential energy relations and representative electrode waveform details for the FIG. 7 dark charge removal arrangement.

DETAILED DESCRIPTION

The relatively low cost, small size and modest power supply requirements of charge coupled device arrays has made this technology a candidate for the large temporary memories needed in military signal processing where, for example, a weak, distantly-sourced signal mixed with heavy components of random noise is to be extracted through repeated signal integrated in a post-detection integration processor.

Figure 1:
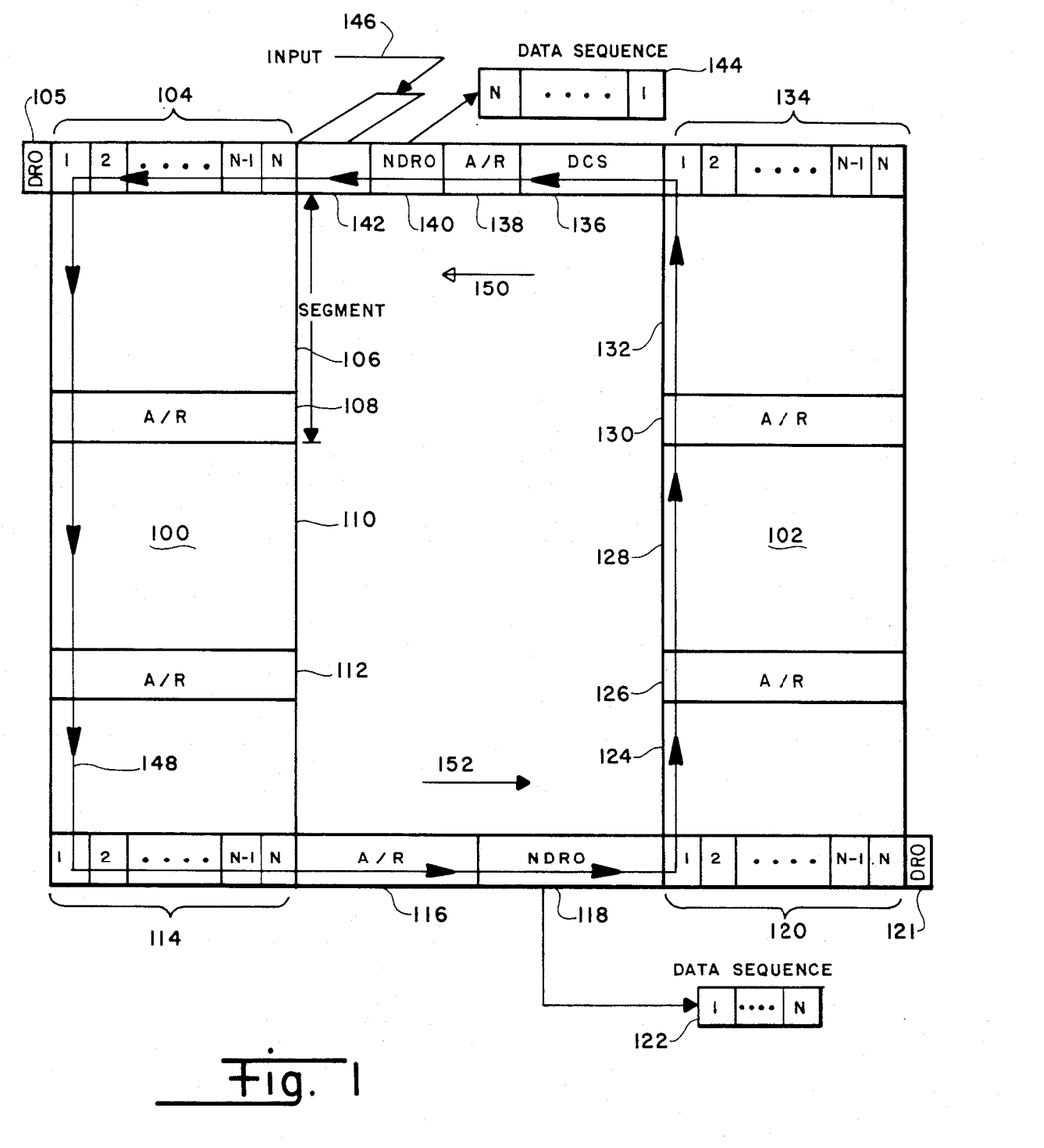
FIG. 1 is a block diagram of a closed-loop charge coupled device (CCD) array circulating memory.

In the FIG. 1 drawing is shown a block diagram of a closed-loop circulating memory apparatus such as may be embodied with charge coupled devices (CCDs) for inter alia achieving temporary dynamic storage of input signal data during integration signal processing. The memory arrangement in FIG. 1 contemplates receipt of a serial input signal along the path 146, principal signal storage in a pair of parallel storage register stacks 100 and 102, and communication between the parallel stacks 100 and 102 along a pair of serial paths 150 and 152. Each of the parallel storage register stacks 100 and 102 includes a serial input and output register, 104 and 114 for the stack 100, and 120 and 134 for the stack 102.

Within each of the parallel storage register stacks 100 and 102 is located several groups of parallel transfer storage registers, as indicated at 106, 110 and 148 for the stack 100, and at 124, 128 and 132 for the stack 102. Also located in each of the stacks 100 and 102 is one or more additive refresh circuits, 108 and 112 in the stack 100, and 126 and 130 in the stack 102.

Signal communication between the stacks 100 and 102 is accomplished by way of the path 152 which couples signals from the output of the stack 100 to the input of the stack 102 and which includes a serial additive refresh circuit 116 and a non-destructive readout (NDRO) tap circuit 118. The NDRO tap circuit can, for example, be embodied in the form of a charge to voltage signal amplifier circuit of the types described in U.S. patent applications of Ser. No. 06/203,092 filed Nov. 3, 1980 now U.S. Pat. No. 4,559,638 and in U.S. Pat. No. 4,041,298 in the name of inter alia D. R. Lampe, which are hereby incorporated by reference into this specification. In such an amplifier, CCD charge is converted to a voltage signal for outputting purposes. In previous uses this voltage signal is subsequently converted back to a CCD charge signal for serial propagation in the following CCD stages. Because of the limited amount of charge (signal) employed in a CCD, direct readout of CCD charge without "destruction" of the readout signal charge has been difficult to achieve and use of an amplifier of the type described is desirable. Another readout arrangement for CCD signals is disclosed in the U.S. Pat. No. 3,781,574 issued to M. H. White et al, colleagues of the present inventors; the '574 patent is also incorporated herein by reference. The '574 patent concerns a readout arrangement for a parallel-to-serial CCD array which uses a two-step time correlated procedure for removing noise components in the CCD propagated signal.

The NDRO tap circuit, 118 in the FIG. 1 SPS array, provides the readout in the order shown at 122. Signal coupling between the output of the stack 102 and the input of the stack 100 is similarly accomplished by way of the communicating path 150 which also includes a serial additive refresh circuit 138, a second non-destructive readout tap circuit 140, an output storage register 144, an input circuit 142, and a dark current subtraction circuit (DCS) 136.

Destructive readout circuits (DRO) 105 and 121 are included in the FIG. 1 circulating memory in order to remove data circulating around the path 148 in the memory when replacement with new data is desired. Entrance of data into the DRO circuits or transfer to the adjacent parallel registers 106 and 124 is made elective, depending upon the need for memory recirculation or clearing.

With regard to details of the FIG. 1 elements, an arrangement for sampling an analog input signal in the circuit 142 in the FIG. 1 drawing (to provide a series of storable discrete analog charge packets for the potential wells created at the surface of a CCD device) is described in the article "Charge Coupled Semiconductor Devices" published in the Bell System Technical Journal of April 1970 by W. S. Boyle and G. E. Smith. The Boyle and Smith article is hereby incorporated by reference herein.

Another data input arrangement for an analog SPS memory—one which is also compatible with a desirable memory arrangement wherein each datum is represented by four push/pull stored signals received at the memory input; a + signal, a − signal, and a dummy charge collecting signal for each, is shown in FIG. 4 of the drawings. The FIG. 4 apparatus is in addition to the abovementioned U.S. Pat. No. 3,781,574 and Bell Systems Technical Journal input arrangements. The FIG. 4 arrangement includes a plurality of analog amplifiers, capacitor storage elements, and signal switches; the switches of FIG. 4 can of course be embodied as transistors as is known in the electronic art.

Figure 4A:
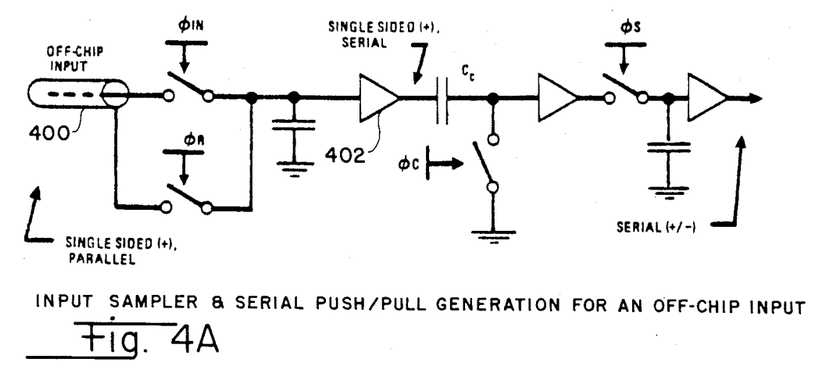
FIGS. 4A to 4C, is a symbolic diagram of SPS memory input and output circuits and operational waveforms relating thereto.

The input circuit shown in FIG. 4A transforms a continuous analog signal into sampled data form and translates a reference level (typically the shield of the coaxial cable 400 in FIG. 4A) to a new level used locally within the SPS CCD device. Two signals are generated in the FIG. 4A signal processing and these signals are contemplated to receive idential treatment during SPS memory storage so that subsequent subtraction eliminates leakage and other offset non-uniformities.

Figure 4B:
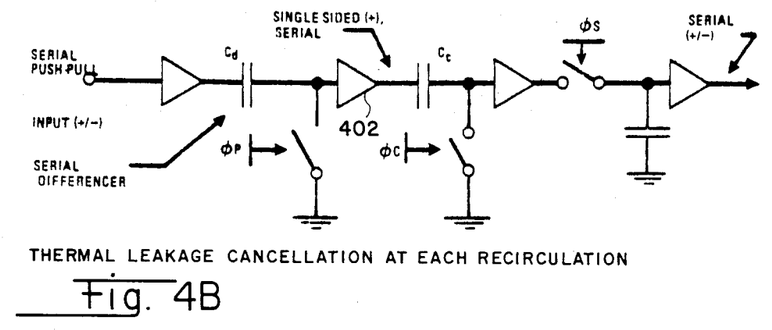

The right-hand most portions of the FIG. 4A and 4B circuits can be observed to be similar in nature; this right-hand portion commencing with the amplifier 402 in each circuit actually comprises a serial push/pull generator arrangement. The input circuits coupled to the push/pull generators differ according to circuit function in FIG. 4 with the FIG. 4B input circuit comprising a serial differencer useful in receiving a push-/pull serial input and the FIG. 4A circuit representing a single-sided data sampler useful in converting from single to push pull/signal form.

Figure 4C:
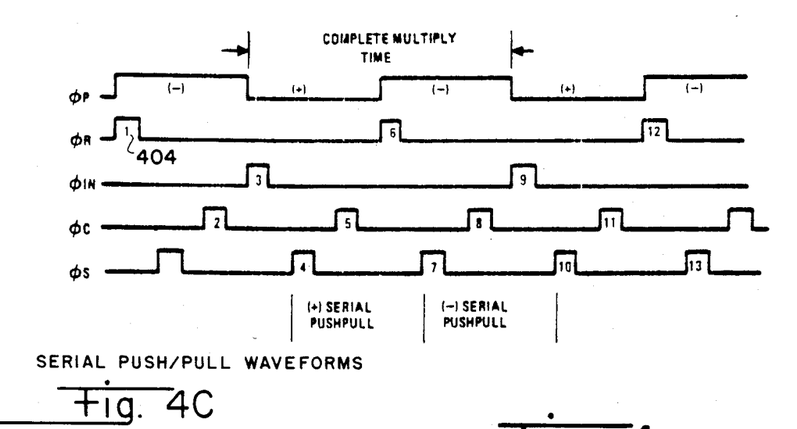

The steps needed to generate push/pull analog signals in serial fashion are enabled by the pulses shown in FIG. 4C of the drawings. The same basic sequence is valid for either an off-chip input signal or for signals received from another on-chip node such as might occur at a CCD tap or in receiving the output of another on-chip circuit. The flow of data through the serial differencer cascaded with the serial push/pull generator as shown in FIG. 4B is illustrated in the Table 1 below. The data flow for the circuit of FIG. 4A is essentially similar to Table 1 with correponding nomenclature of nodes being used.

Referring now to FIG. 4C, at time (1), indicated at 404, the negative push/pull data arrive and are stored on capacitor $C_d$ in FIG. 4B. Switch $\phi C$ stores the local reference (LR) on clamp capacitor $C_c$ at the time (2). The positive push/pull data (Y+) arrives at time (3) and has substracted from it the previously stored negative data (Y−) to give the enhanced result $Z=(Y+)-(Y-)$. In the Z signal "even-powers" distortion is cancelled. The Z signal is then subtractively combined with the local reference previously stored on the clamp capacitor $C_c$ to give the newly processed output at time (4) which may be reinjected into the analog memory or used elsewhere as the leading signal sample of the push-/pull pair. At time (5), the value (Z), which is still being applied to clamp capacitor $C_c$, is stored there by the reactivation of the clamp switch $\phi C$.

While a new data push/pull pair starts arriving and the first sample thereof is stored on the capacitor $C_d$ at time (6), the closure of switch $\phi P$ places the local reference at the buffer amplifier 402. Subtraction of the quantity (Z) stored on capacitor $C_c$ at time (5) then gives the signal ((LR)-(Z)) which is sampled at the outut. In this manner, the complementary push/pull signals are generated serially using the same serial circuit elements for each signal. This arrangement provides a matched 180° inversion between the two samples and improves rejection of even power distortion as well as provides cancellation of array offset nonuniformities.

TABLE 1

DATA FLOW THROUGH THE SERIAL DIFFERENCER AND SERIAL PUSH/PULL GENERATOR

| Time | 1 | CD | 2 | CC | 3 | 4 |
|------|-----|-----|-----|-----|-----------|-----------|
| 1 | Y1− | Y1− | LR | — | — | — |
| 2 | Y1− | Y1− | LR | LR | LR | — |
| 3 | Y1+ | Y1− | Z1 | LR | (Z1)-(LR) | — |
| 4 | Y1+ | Y1− | Z1 | LR | (Z1)-(LR) | (Z1)-(LR) |
| 5 | Y1+ | Y1− | Z1 | Z1 | LR | (Z1)-(LR) |
| 6 | Y2− | Y2− | LR | Z1 | (LR)-(Z1) | (Z1)-(LR) |
| 7 | Y2− | Y2− | LR | Z1 | (LR)-(Z1) | (LR)-(Z1) |
| 8 | Y2− | Y2− | LR | LR | LR | (LR)-(Z1) |
| 9 | Y2+ | Y2− | Z2 | LR | (Z2)-(LR | (LR)-(Z1) |
| 10 | Y2+ | Y2− | Z2 | LR | (Z2)-(LR) | (Z2)-(LR) |
| 11 | Y2+ | Y2− | Z2 | Z2 | LR | (Z2)-(LR) |
| 12 | Y3− | Y3− | LR | Z2 | (LR)-(Z2) | (Z2)-(LR) |
| 13 | Y3− | Y3− | LR | Z2 | (LR)-(Z2) | (LR)-(Z2) |

(Yk+, Yk−) designate push/pull data
(Zk) = (Yk+) -(Yk−) = single-sided data
(LR) = local reference Returning now to FIG. 1, the first stack input register 104 may be observed in the drawing to receive signals from either the serial input path 146 in the case of newly-entered signals, or from the path 150 in the case of memory circulated signals. The analog signals from these two sources are, in effect, logically "ORed" in the input circuit 142. In this arrangement the first stack input register 104 performs as both an input serial and an output direction changing register capable of transferring a serially received word in parallel to storage registers in the parallel transfer storage register group 106.

The underlying concept for employing the parallel storage register stacks 100 and 102 and separated signals in these stacks in lieu of a serpentine or serial-only form of recirculating memory, as described in the above-identified Kosonocky and Sauer publication, for example, concerns the number of high-speed serial transfer events occurring in one complete circulation of information around a loop. More specifically, in some practical uses of the CCD apparatus, information circulations in the order of 10,000 times are desirable. With 10,000 circulations, an additional crosstalk degradation of 80 dB beyond that for a single path through the memory must be expected. The stringent requirements on charge transfer efficiency imposed by the need for many recirculations are best illustrated mathematically.

The isolation (I) between analog signals carried in sequential charge packets, may be obtained from the binomial expansion theorem:

$$I(t, N) = q_0(N)/q_t(N) = \frac{t! (N-t)!}{N!} (1/\epsilon^* - 1)^t$$

where: $q_t(N)$ is the relative amplitude of the signal (after N stage propagation) which has lagged into the $t^{th}$ charge packet behind the proper one (t=0), and $\epsilon^* = (p)$ ($\epsilon$) = effective charge-transfer inefficiency per stage (of "p" gates or electrodes per stage of $\epsilon$ inefficiency per electrode); $\epsilon^*$ is assumed here around $10^{-4}$. For example, in a 100-stage memory where each stage has four gates which may be connected and operated in either four or two or 1½ phase modes, the signal isolation I is given by:

$$I(1,100) = (1/10^{-4} - 1)/100 = 99.99 \text{ or } 40 \text{ db}.$$

Such small isolation between data samples in a memory which might be used to multiplex MTI or Doppler radar signal channels would be intolerable and produce many false targets.

If, however, an extra "isolation stage" is used between each piece of analog data, requiring 200 stages in contrast to the 100 previously mentioned; then the resultant isolation between data becomes:

$$I(2,200) = 2/(200)(199) \times ((1/10^{-4}) - 1)^2 = 5024.12 \text{ or } 74 \text{ dB}.$$

Thus, 60-dB isolation between data samples can be achieved for 100 samples by using two stages per sample. If the memory incorporates an additive refresh stage of the type discussed by Kosonocky and Sauer, then periodically the signal charge lagging behind into an isolation position can be added back to the signal charge packet—by holding the signal charge packets stationary, then clocking the isolation packets containing the lagged signal charge forward so as to combine the two charge packets.

If the above example is then extended by incorporating an additive refresh stage as the last stage pair at the end of 200 stages, cascading five such sections will provide 1000 stages to store 500 analog samples. Although the crosstalk for each section does not exceed (−74 dB), because the lagging signal charge in the isolation position is removed and must accumulate anew within each section, the "crosstalk signal" which lagged into the second delay position simply adds directly the same contribution from each such cascaded section.

Thus when five 200-stage sections are cascaded with their additive refresh stages, the overall isolation becomes:

$$I^*(2,200/5) = 5024.12/5 = 1004.8 \text{ or } 60 \text{ dB}.$$

Therefore, the additive refresh technique used every 200 stages or 100 data samples enables the storage of 500 data samples while maintaining 60 dB isolation between data samples. The preceding discussion and results for the additive refresh technique can readily be expressed in a more general formula for the case where (L) segments of (K) stages (including the additive refresh stages) are cascaded in series.

$$I^*(K, L) = \frac{2}{(K)(K-1)(L)} \times ((1/\epsilon^*) - 1)^2$$

This relationship also applies for recirculation. For example, the above 1000-stage memory might be recirculated eight times during the process of forming an 8-point Doppler Transform. Hence K=200, but L=5×8=40 to give:

$$I^*(200, 40) = \frac{2}{(200)(199)(40)} (10^4 - 1)^2 = 125.6 \text{ or } 42 \text{ dB}.$$

Consequently, the final crosstalk associated with the signal processing must include the effects of recirculation during the computation, such effects typically add an extra 20-dB crosstalk when the data pass through the memory ten times. Since many Doppler channels may involve 32, 64, or more pulse returns, good charge transfer performance must be achieved by an analog memory.

Furthermore, these predictions are optimistic in that perfect refreshing is assumed to re-create a dummy charge packet totally free of any signal content. Since charge separation or subtraction is more difficult than conventional CCD charge transfer, the dummy charge packet will inevitably contain traces of the signal even immediately following the refresh operation. Therefore, the crosstalk expected for a large serpentine memory, even with frequent refreshing, is unlikely to exceed the expected degradation for many recirculations (up to 80 dB) by an amount needed by typical signal processing systems (over 50 dB to 60 dB).

The parallel transfer storage registers 106 in FIG. 1 together with the additive refresh circuit 108 comprise a segment of the recirculating memory apparatus; there are several such segments in each of the stacks 100 and 102. A stack is moreover not limited to the two segments illustrated in the FIG. 1 drawing, but in an actual embodiment may include numerous segments. The stacks and other circuits illustrated in the drawing are preferably embodied in the form of monolithic integrated circuit charge coupled devices.

The ability to circulate analog signals while encountering a minimal degree of signal degradation can be enhanced in the FIG. 1-illustrated memory through use of the previously mentioned coding arrangement wherein a positive representation of the analog signal and a negative representation of the same analog signal together with dummy or reference signals for each are propagated as a four-charge signal packet through the stacks 100 and 102 and serial paths 150 and 152. An input circuit arrangement for placing received data into this form is described above in connection with FIG. 4; the apparatus for generating the negative representation of the analog signal and for generating the associated dummy signals may also be located in the signal path preceding the input signal 146 in the FIG. 1 illustrated embodiment of the invention. Use of positive and negative representations of a received analog signal, together with accompanying each the positive and negative representations by a dummy CCD charge packet capable of accumulating charge transfer imperfection signals enables the additive refresh circuits 108, 112, 116, 126, 130, and 138 in the FIG. 1 drawing to more accurately reconstruct the originally propagated signals and thereby accept a greater number of memory circulations for a given degree of signal degradation. At each of these additive refresh locations, recombination of the dummy or reference signal and its associated signal is achieved in order that overall signal degradation realized in the intervening CCD memory stages be substantially corrected.

The concept of intermediate dummy signals for sample-to-sample isolation and for accumulating the residual charge remaining in a CCD well is further described in the U.S. Patent of Donald R. Lampe et al, U.S. Pat. No. 4,035,629, which is hereby incorporated by reference into the present specification. The Lampe '629 patent also defines sample-to-sample isolation and relates this phenomenon to crosstalk between signal samples occurring in apparatus employing parallel and serial data transfer arrangements. The extended correlation double sampling (ECDS) as also described in the '629 patent is especially helpful in the case of thermal leakage degradation of memory signals and in essence uses two analog signal samples to record a single data point in a CCD array. One of these samples is a reference plus the desired signal while the other is the same reference minus the desired signal. Since both of these samples follow the same path, thermal leakage is added equally to both samples. Since the output signal of this arrangement is formed by the difference between two samples, thermal leakage as well as even harmonic distributions are canceled. ECDS is also described in somewhat greater theoretical and implementational detail in U.S. Pat. No. 4,034,199 titled "A Programmable Analog Transversal Filter" also by Lampe et al, which is additionally incorporated herein by reference. The coupling circuits shown in FIG. 4 of the drawings may be used in establishing the ECDS data format.

The concept of employing additive refresh correction for crosstalk degradation of CCD signals is an additional topic described in the above-incorporated Kosonocky and Sauer publication. The number of additive refresh circuits and the number of memory stages between additive refresh circuits in a single segment of the present circulating memory is, of course, dependent upon the characteristics of the CCD's employed, ten stages between address refresh memory circuits is, however, a representative arrangement.

Conceptually in additive refresh operation, each signal sample is merged with or added to its following dummy charge packet and then the refreshed signal samle is drained forward by requiring it to pour over a fixed height potential barrier which leaves the new dummy charge packet behind. In this manner any signal charge lagging behind due to charge transfer inefficiency is recovered from the trailing dummy charge packet and restored to the original signal sample. Any charge similarly accumulated from the preceding dummy is presumed equal to that lost by the trailing dummy, which is added to the inverted signal sample (the negative half of a push/pull signal) thereby cancelling when the difference is serially derived.

Therefore, according to the additive refresh concept a trailing dummy charge packet is caused to follow the signal charge packet along a propagation path—with the dummy charge packet accumulating signal charge which lags behind its original signal packet. Periodically, a two-step refresh operation first adds the two charge packets together, then subtracts (in the manner of a bucket brigade device) a fixed charge quantity which serves as the new trailing dummy charge packet. According to this arrangement, a local additive refresh cell has no a priori information about the data it is processing. Therefore, the only partitioning of the combined charge packet which the refresh cell can accomplish is the removal of a constant amount of charge, that is, a charge which is invarying with time, but responsive to local non-uniformities between one CCD well and another. According to this arrangement then, the trailing dummy charge packets contain no directly usable signal data information and exist solely for the purpose of improving the apparent charge transfer efficiency. These charge packets must, however, be handled with care throughout the memory to prevent local non-uniformities from contaminating the true bias levels of stored signals.

Placement of additive refresh cells in the serial paths 150 and 152 in FIG. 1 assures that non-uniformities between refresh cells will cancel when the two samples for each datum point are subtracted. This arrangement of four CCD stages for each analog datum is supported by the need for two stages for providing subtractive cancellation of offset non-uniformities and two more stages for dummy charge packets for providing the desired isolation via additive refresh.

For CCD memories which are to be capable of a large number of signal passes around the closed memory loop using reasonably attainable values of charge transfer inefficiency, $\epsilon$, a better distribution of refresh cells than one such cell in each of the paths 150 and 152 in FIG. 1, is required to obtain acceptable performance from a CCD memory loop (calculated attainable isolation together with isolation degradation by multiple passes provides an overall isolation in the range of 56 dB, for example, for a simple 25-column by 40-stage CCD memory having eight passes). This need for additional additive refresh cells necessitates the location of such cells in the stacks of each SPS subarray as shown at 108, 112, 126 and 130 in FIG. 1.

Figure 2A:
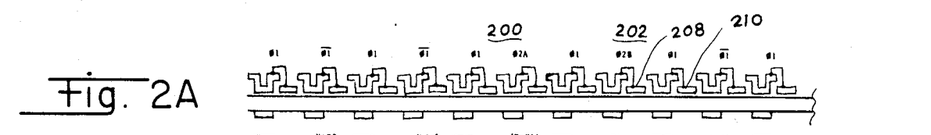
FIGS. 2A to 2C, shows an additive refresh apparatus and its operation.
Figure 2B:
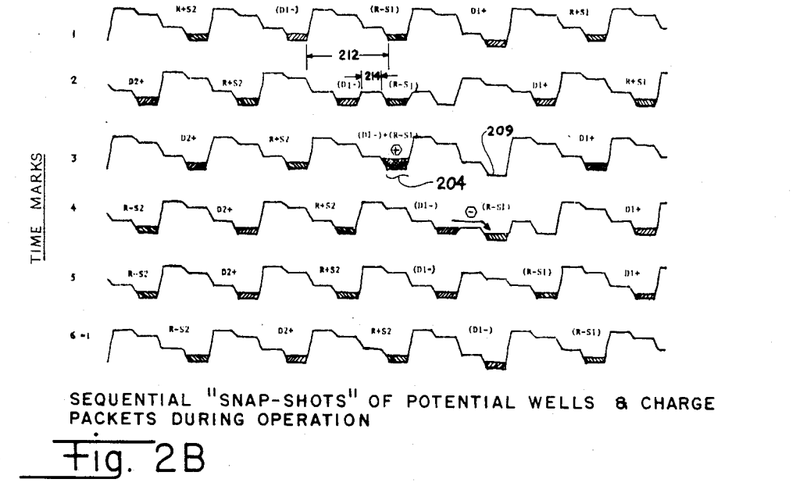
Figure 2C:
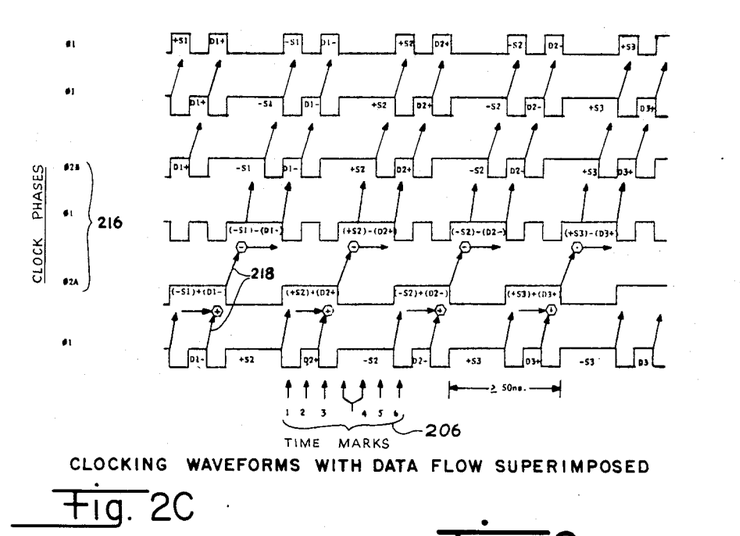

A two-phase example of an additive refresh cell and its operation are shown for explanatory purposes in FIG. 2 of the drawings. In FIG. 2, the FIG. 2A portion represents a simplified integrated circuit arrangement of a shift register which includes near its center an additive refresh cell. Operation of the FIG. 2A two-phase shift register and additive refresh cell, illustrated in FIGS. 2B and 2C, involves use of a complementary clock pair, $\phi 1$ and $\bar{\phi}1$, for the conventional shift register stages portion. The FIG. 2 additive refresh cell, however, requires the presence of two stages (A and B) indicated at 200 and 202 in FIG. 2A in which the $\phi 1$ waveform is replaced by the $\phi 2A$ and $\phi 2B$ waveforms respectively. The $\phi 2A$ and $\phi 2B$ waveforms and their differences from the $\phi 1$ and $\bar{\phi}1$ waveforms are shown in the FIG. 2C portion of FIG. 2.

The waveforms in FIG. 2C relate to the circuit structure in FIG. 2A according to the clock phase identifications shown at the left side of FIG. 2C; the clock phase sequence $\phi 2A$, $\phi 1$, $\phi 2B$ at 216 in FIG. 2C, for example, corresponds to the clock signals specified for the FIG. 2 additive refresh cell stages at 200 and 202 in FIG. 2A. The sequence of clock phase signals shown in FIG. 2C therefore exactly corresponds in bottom to top order to the sequence required commencing just to the left of the stage 200 in FIG. 2A and continuing in left-to-right order past the stage 202 in FIG. 2A. In addition to this relationship in FIG. 2, the waveforms in FIG. 2B are located vertically below the pertinent electrodes of the FIG. 2A structure so that the potential energy values represented in FIG. 2B correlate to the voltage potential of the electrode located vertically above the potential energy level under consideration. In the case of electron signal charge this correlation is negative however—deep energy wells correlating to large positive electrode voltage. In addition to these relationships in FIG. 2C, the flow of signal charges in response to the FIG. 2C waveforms is indicated in the manner shown at 218 in FIG. 2C, signal charges generally flowing up and to the right in FIG. 2C in correspondence to signal flow from left to right in FIGS. 2A and 2B.

The addition of the two charge packets (i.e. the data and dummy signal charge packets) occurs in the A stage indicated at 200 in FIG. 2A while the partitioning of the summed charge packet occurs in the "B" stage indicated at 202. The partitioning as indicated above restores the dummy isolation charge packet to be free of any signal charge contributions.

The waveforms of FIG. 2B show the charge packets arranged in pairs and the identifications (R±SJ) represent a reference signal plus and minus the Jth data signal sample and the identifications (DJ±) represent associated dummy trailing bias charge packets. Moving downwardly in FIG. 2B, or left to right in FIG. 2A and left to right along the time marks indicated at 206 in FIG. 2C; from time mark (1) to time mark (2), all of the clock phases reverse (except $\phi 2A$), thereby advancing all of the FIG. 2B charge packets except the data sample at the position 200 and thereby halving the separation distance between that data sample and its respective dummy isolation packet (the distances 212 and 214 in FIG. 2B). With another such reversal of the clock phases between time marks 2 and 3 at 206 in FIG. 2, the two associated charge packets are added at time mark (3), under gate (2A) as indicated at 204 in FIG. 2B.

In the transition from time mark (3) to time mark (4) in FIG. 2 all clocks again reverse except the clock $\phi 2B$, which controls the gate 208 and the empty site 209 in FIGS. 2A and 2B respectively. The site 209 was an empty site attractive to the signal charge. Thus, as soon as the combined charge packets fall into the storage well under the $\phi 1$ gate 210 in FIG. 2A—which is located directly upstream from the gate 208, a previously established attractive potential pulls some of the combined charge packet forward toward the storage well 209, thereby beginning the partitioning part of the refresh operation. Because of the "bucket brigade", "fill/- spill", or "source-follower" nature of this partitioning, the setting of the charge left behind at the $\phi 1$ location is a slow process and therefore has been schematically allotted a double portion of clock time indicated by the double width of the time mark 4 at 206 in FIG. 2C.

Only clock $\phi 2B$ changes at the time mark 5, this produces moving of the refreshed data charge packet back into its proper position for shifting through the remainder of the register. The waveforms of FIG. 2C are based on unitary time increments for each forward shift or ADD operation, since these are fast events, and on a double time increment for the SUBTRACT, which is a slower operation. This arrangement emphasizes analog performance at the expense of clock and charge packet waveform complexity, as is observed in FIG. 2.

Figure 3A:
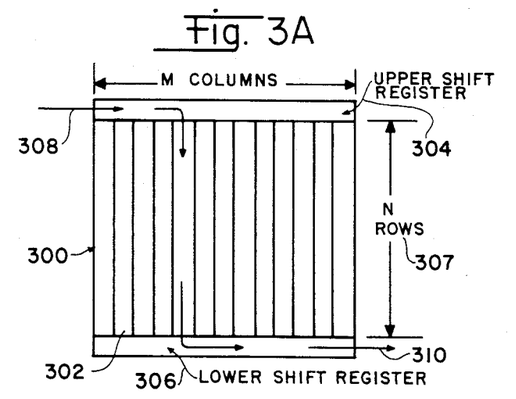
FIGS. 3A to 3C, shows a group of serial-parallel-serial memory signal flow diagrams.

A representation of a basic M column, N row serial-parallel-serial or SPS memory is shown in FIG. 3 of the drawings; in FIG. 3A, the SPS array 300 includes M of the individual columns 302 which couple between an input serial register 304, and an output serial register 306 and includes the N rows of parallel registers indicated at 307. The SPS array 300 in FIG. 3A receives serial input signals 308 at the input serial register 304 and provides output signals 310 at the output of the output serial register 306. Data samples are shifted into the upper shift register until it is full, at which time all samples are shifted down the columns. The FIG. 3A structure will store M·(N+1) samples of data and all samples eventually move through the same number of shifts, M+N+1.

The FIG. 3A SPS uses roughly twice the square root of the number of transfers required of a linear CCD having the same storage capability. It should be noted, however, that since the input signal 308 proceeds along M different paths in becoming the output signal 310 individual CCD well differences can impose a fixed pattern on the serial data stream a FIG. 3A SPS array. Additionally, the corner turn portions of the FIG. 3A apparatus can themselves impose transfer inefficiencies which are not found in the linear portions of the FIG. 3A array.

Figure 3B:
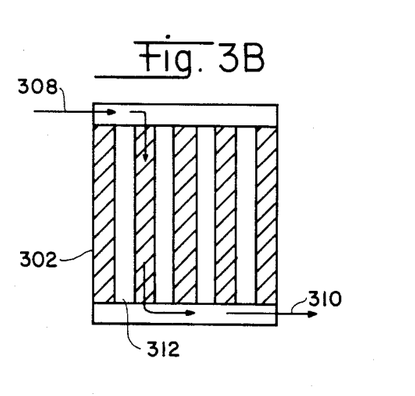

An alternate column SPS capable of accommodating additive refresh dummy or reference charges along with each data sample is shown representatively in FIG. 3B of the drawings, the added column in FIG. 3B is shown at 312, there being a plurality of such added columns, one for each data column 302 in FIG. 3A. FIG. 3B is therefore representative of an alternate column SPS memory and would in reality be larger than shown in order to be comparable with the FIG. 3A SPS structure.

Figure 3C:
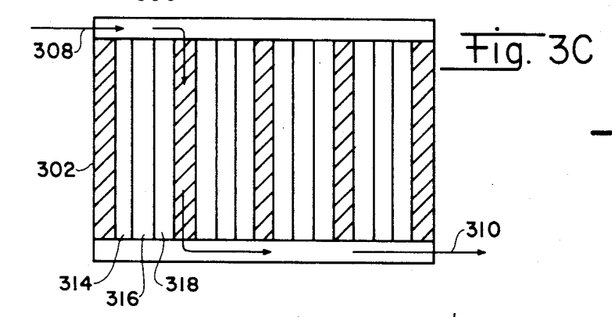

FIG. 3C shows a four-cell per sample SPS array capable of processing push-pull data sets, that is, data sets which as described above embody the received information in the form of a signal plus reference, a dummy signal associated with the signal plus reference, a reference minus signal, and dummy data associated with the reference minus signal. The added columns in FIG. 3C for accommodating the reference minus signal and the two dummy data sets are shown at 314, 316 and 318.

The arrangement for clocking signal between elements of the circulating memory, that is for example, between stages of a segment in the parallel stacks 100 and 102 in FIG. 1, and between serial stages along the paths 150 and 152 is known in the art and is not shown herein. With further regard to clocking considerations, by way of incorporating a minimum number of serial data transfers and a minimum of serial register stages, the apparatus illustrated in the FIG. 1 drawing minimizes clock circuit loading in comparison with other circulating memory arrangements. Since clock signal driving energy is inherently related to the information transfer rate in a CCD array, use of the minimum number of serial stages also reduces the clock circuit current flow and energy dissipation.

Figure 5:
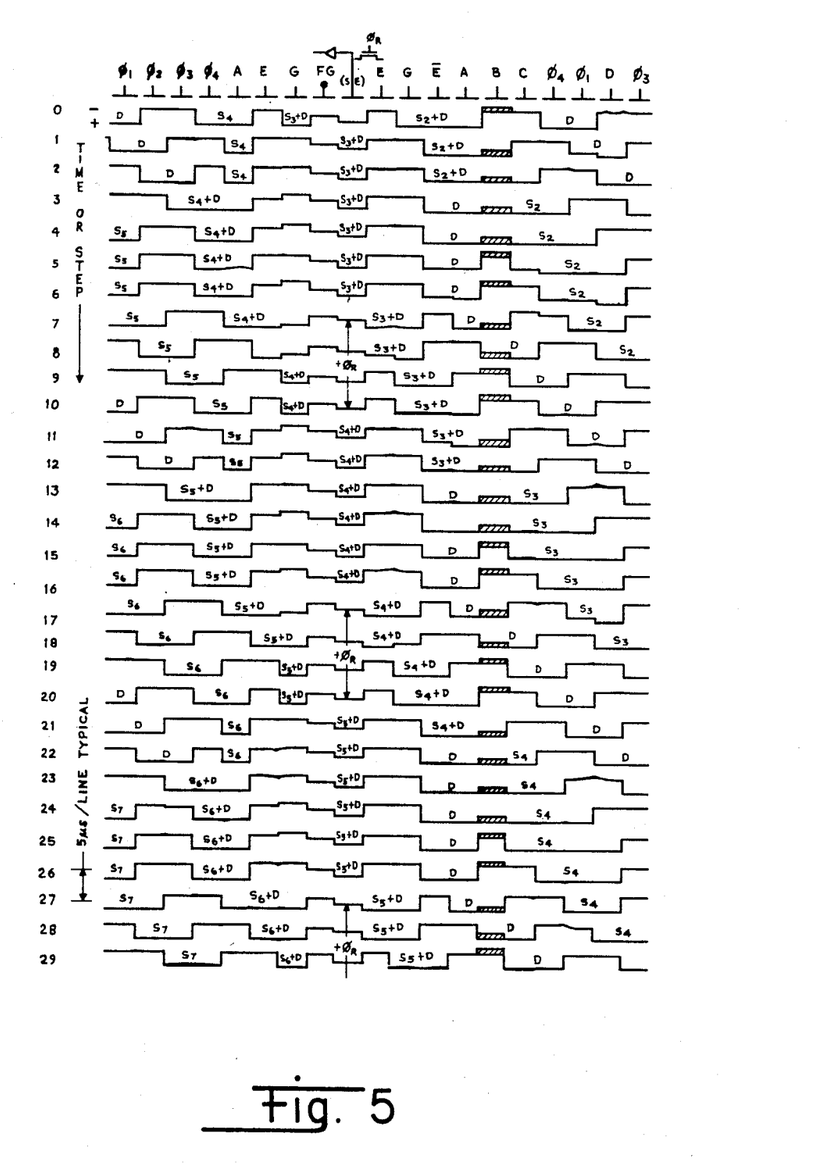
FIG. 5 shows a potential well sequence and symbolic physical layout for a four phase CCD additive refresh, Non-Destructive Readout (NDRO) array.
Figure 6:
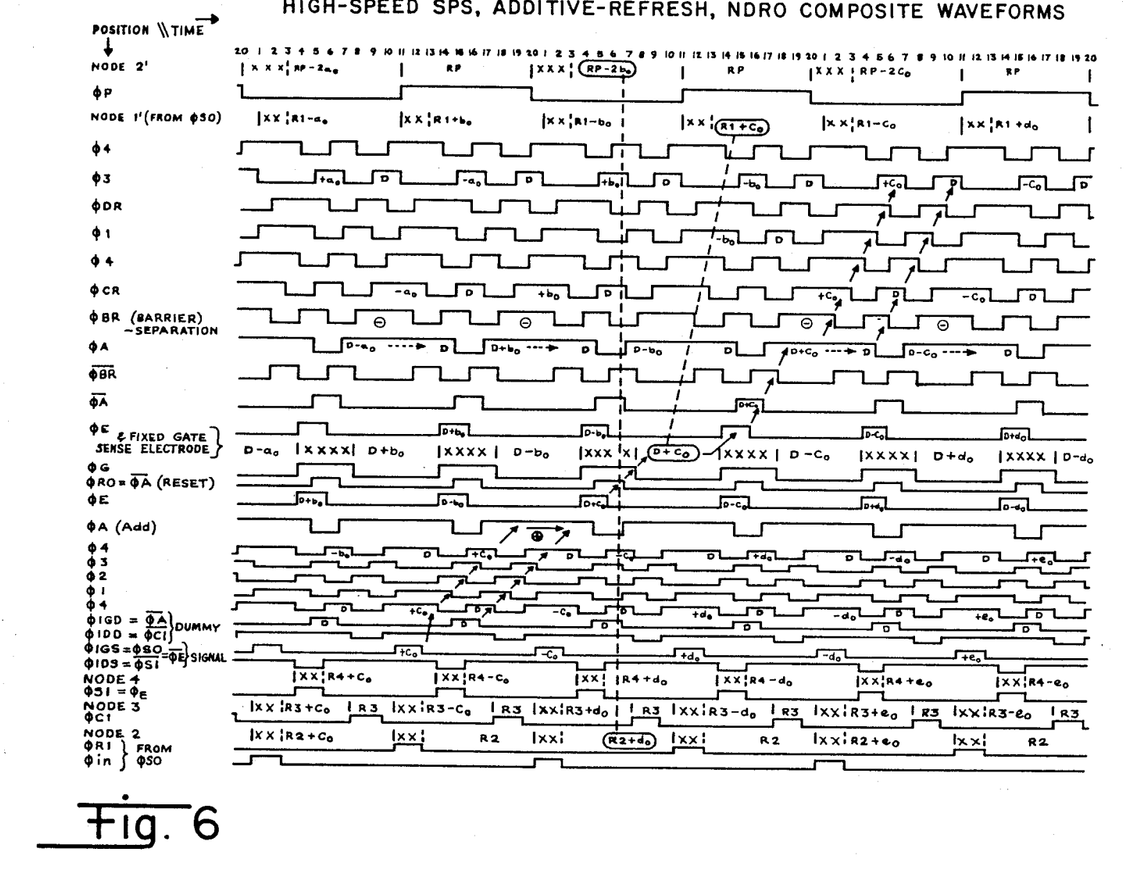
FIG. 6 shows electrode waveforms for the FIG. 5 additive refresh NDRO array.
Figure 7:
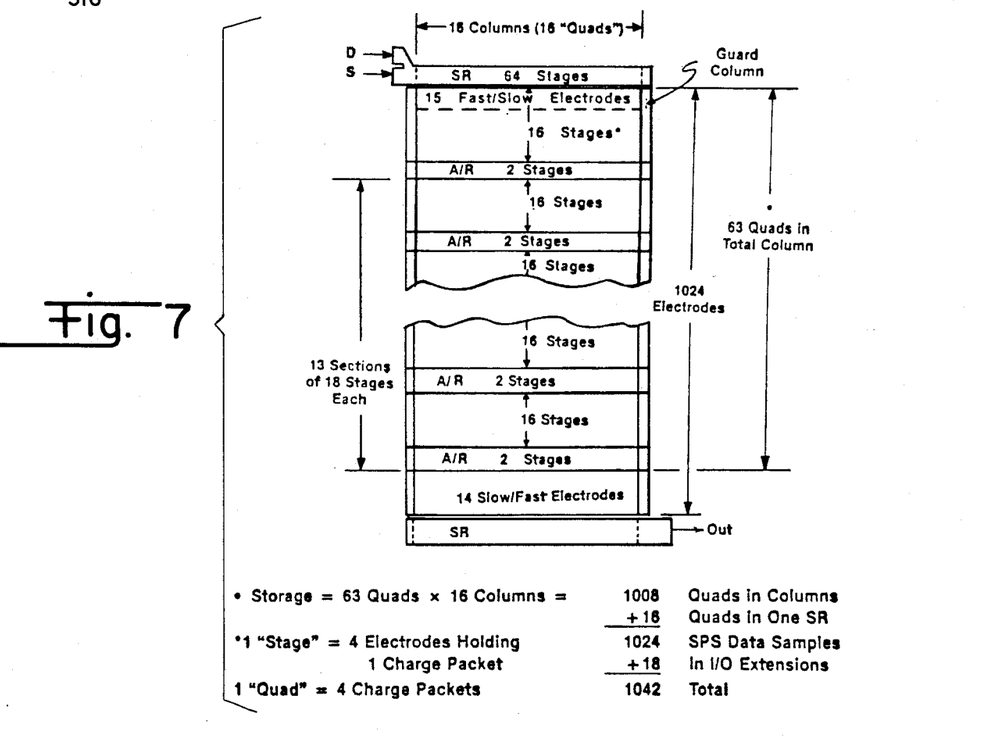
FIG. 7 shows a single serial-parallel-serial memory array together with some of the attending CCD circuit details.

Although the FIG. 2 two-phase additive refresh cell described above is exemplary of such devices a four-phase cell more compatible with the heretofore described embodiment of the invention is shown in FIGS. 5, 6 and 7 of the drawings. Generally, the FIGS. 5-7 CCD structure and waveforms interrelate in the manner of and follow the conventions described above for the different parts of FIG. 2. In the four-phase and two-phase additive refresh apparatus each signal sample is merged with its following dummy charge packet, and the thusly refreshed signal sample is strained off by requiring it to pour over a fixed height potential barrier. This pouring off leaves a new dummy signal behind. In this manner, any signal charge lagging behind the desired signal sample due to transfer inefficiency is recovered from the trailing dummy and restored to the signal sample. Any charge similarly accumulated from the preceding dummy is presumed equal to that lost by the trailing dummy, which is added to the inverted signal sample, thereby cancelling when the ultimately used difference signal is serially derived.

This merge-and-reseparate operation involves special waveforms and, in fact, requires the memory to pause during the serial reseparation action as shown at the left-hand edge of FIG. 6 in the drawings for times 1, 2, and 3 and is also shown in FIG. 5 where the potential wells are diagrammed. This pause in the signal flow does not violate an equal-time-in-each-position criterion, since such a pause happens to every signal/dummy pair, and alternate pairs are sutracted to obtain the true sample value in each R+S, D, R−S, D signal quad.

A single SPS array is diagrammed with some added CCD details in FIG. 7 of the drawings. The additive refresh (A/R) steps are included in each FIG. 7 indicated column plus one A/R in each serial non-destructive output in FIG. 7. Since it is desirable to keep the complication of refresh out of the fast/slow transit region in the FIG. 7 array, the lowest column A/R cells are located directly above the bottom fast/slow region in the CCD structure. Within the FIG. 7 column, the A/R cells are separated by 16 normal cells. The fast/slow transition are at the bottom of the column is added to the cell count at the top of the column in the next SPS part. The fast A/R cell in the serial output is included to restore any serial transfer inefficiencies in the upper and lower shift registers.

The required pause in the operating clock described above to allow the signal reference reseparation from the dummy to take place provides a unique opportunity to effect the desired NDRO action without some of the difficult speed requirement which would otherwise be placed on the employed CCD electrometer circuit.

FIG. 5 diagrams the potential well sequence as charge moves through the A/R-NDRO electrode chain. In FIG. 5, the signal charge, S4, and its trailing dummy reference, D, are shown to move along under the phased electrodes which commence at the upper left corner of the figure. The charge S4 halts under electrode A while the dummy reference charge catches up and merges with it in step 0. The above-described pause occurs in steps 1, 2, and 3 while the previous charge S2 and its dummy are reseparated. The merged S4+D charge is then swept along to electrode G in steps 4, 5, 6, and 7 whereupon it is dumped over a fixed gate, FG, in step 8 and pours into the potential well under the reset electrometer electrode. The electrometer now has 6 counts (30 ns) to settle while the previous charge S3 is being reseparated and the subsequent charge S5+D is being readied. At step 14, electrode E goes attractive and the S4+D charge flows out under E and G. Two counts complete this flow, whereupon electrode E "closes" behind the S4+D charge and the electrometer is reset. Steps 17-23 reseparate the S4 and D charges in an additive refresh manner.

Sensing the combined charge gives the advantage that it is a CCD circuit state which can be held for a relatively long time, thereby reducing amplifier bandwidth requirements. The effective electrometer "swing" may actually be smaller because of the larger capacitance needed to hold the dummy charge as well as the signal/reference charge.

FIG. 6 shows the waveforms required for each electrode in the FIG. 5 CCD array. The basic four-phase clock is stretched on alternate cycles to allow time for the A/R reseparation act. Seven unique waveforms are shown to be required.

Figure 8:
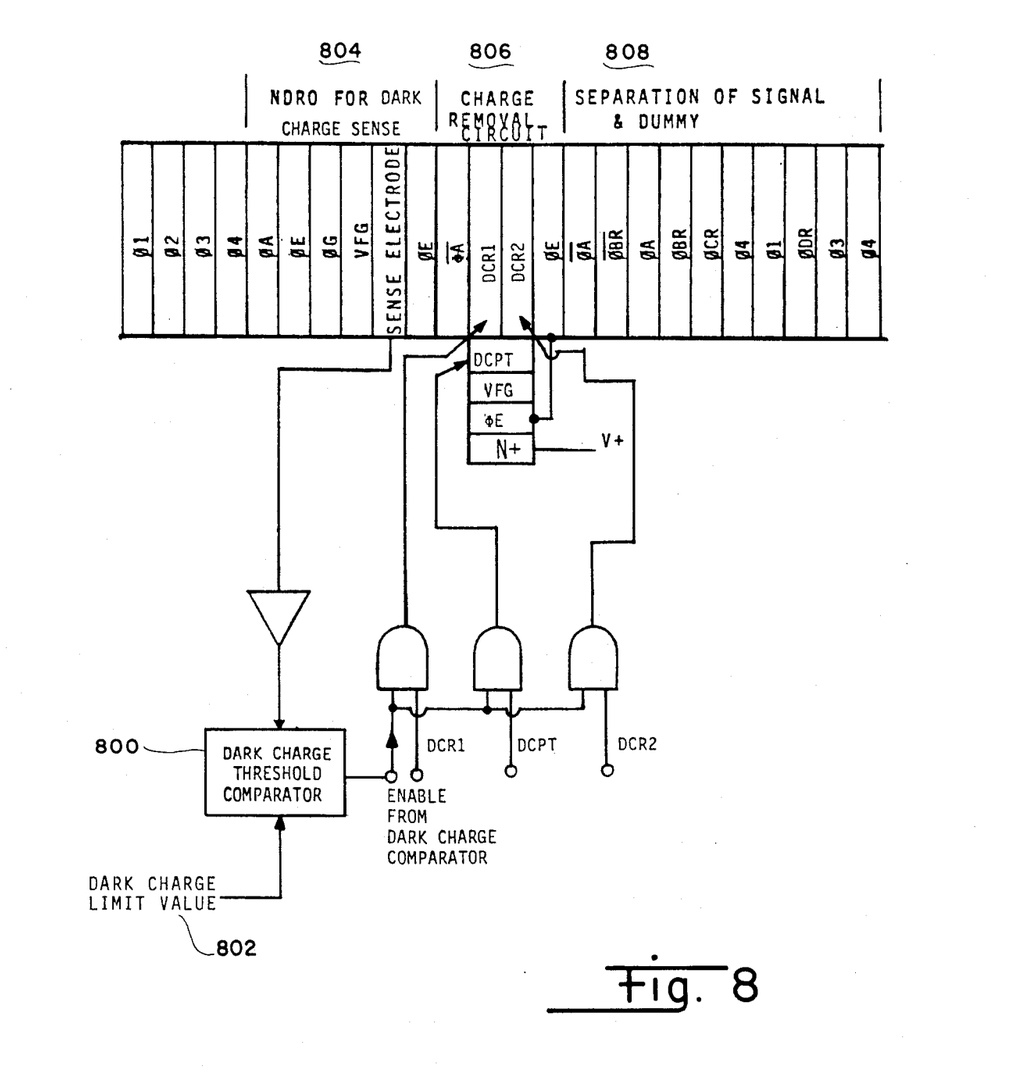
FIG. 8 shows a dark charge removal arrangement such as might be used in the FIG. 1 CCD memory.
Figures 9, 9C:
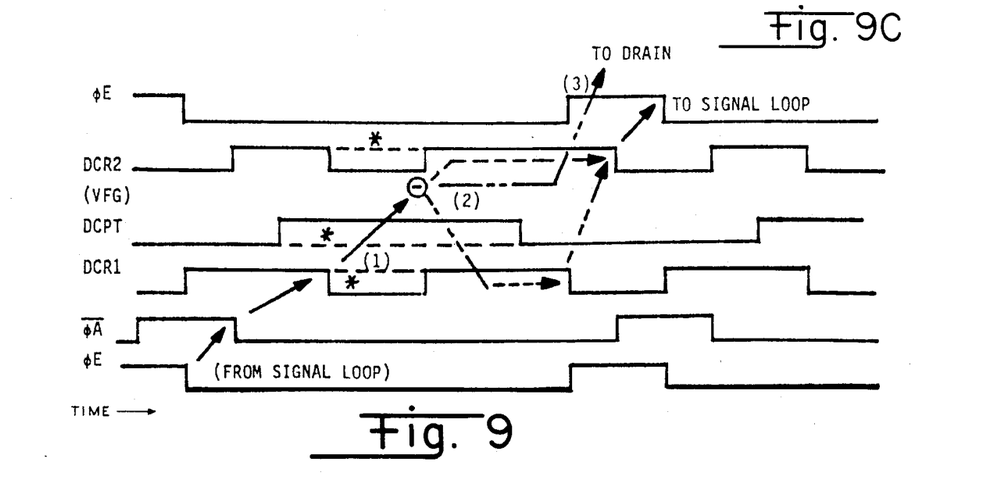

The dark charge subtraction circuit 136 in FIG. 1 serves to remove from the circulated signal the charge packet components which are non-information bearing and located at the lower end of the signal dynamic range. Dark charge is generally considered to be the time integral of the dark current over some time interval. Additional details of a dark charge subtraction circuit, such as is used at 136 in FIG. 1, are shown in FIGS. 8 and 9 of the drawings. FIG. 8 shows schematically or topographically that part of the signal recirculation loop or flow path 148 containing the dark charge removal circuit. The electrodes shown in FIG. 8 and identified with respective clock phase nomenclature could comprise part of the FIG. 1 memory apparatus, specifically the CCD stages preceding and just following the dark charge subtraction circuit 136; signal flow through the FIG. 8 array is, however, from left to right rather than flow in the contra direction, as might be implied from FIG. 1. In combination with the serial additive refresh and the nondestructive readout (NDRO) described in FIGS. 5-7 herein, the dark charge is, in the FIGS. 8 and 9 circuitry, sensed and compared to a limit threshold value by means of a comparator circuit 800 in FIG. 8. This threshold comparison against a limiting value 802 of dark charge is performed on a special signal charge packet from the memory recirculating loop, a packet containing only Fat Zero and thermal leakage charge contributions but free of the desired ac signal. When ac signal is present, however, a mid-value "Fat Zero" bias charge is used to permit the ac signal to have both positive and negative values around the ac zero-signal level—which is actually the no-signal value Fat Zero.

The decision in the dark charge threshold comparator 800 generates an enable signal which is applied to the charge removal circuit 806 when the threshold or limit value is exceeded. The logic gates shown in the path of the CFR1, DCR2 and DCPT signals in FIG. 8 combine the threshold comparator 800 output signal with the dark charge removal (DCR) electrode control signals to generate waveforms of the general type shown in FIG. 9C of the drawings. In the charge removal circuit, the same fixed quantity of charge is removed from energy data sample location within the recirculation loop of data. If the dark charge level in the data sample locations does not fall below the limiting threshold value after a first dark charge removal event, the charge removal circuit is again activated for another full data recirculation until such time that the Non-Destructive Readout (NDRO) circuit 804 sensed leakage only value falls below the limiting threshold value 802. When the charge removal operation is not activated, the signal charge packets merely propagate through the charge removal circuit 806 transparently—as if it were a classic serial shift register.

The circuitry in FIGS. 8 and 9 presumes that, at the location of the dark charge removal circuit, the signal dependent or signal carrying charge packet is still combined with its trailing charge-receiving dummy charge packet; this arrangement is chosen purposely to allow more time for each of the operations indicated in FIG. 8, but is not absolutely necessary—separate operation on the signal charge packet and the dummy charge packet and similar modifications can be achieved via minor modifications of the illustrated CCD electrode structure and/or the clocking waveforms by those skilled in the art.

Figure 9A:
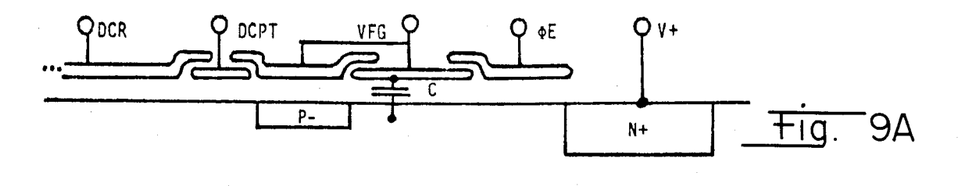
Figure 9B:
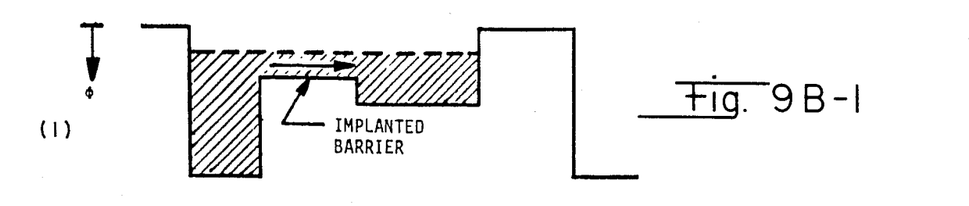
Figure 9B:
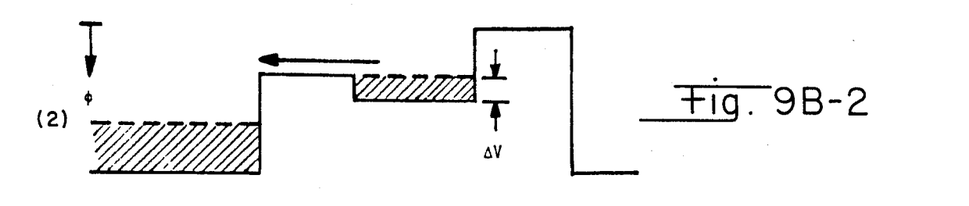
Figure 9B:
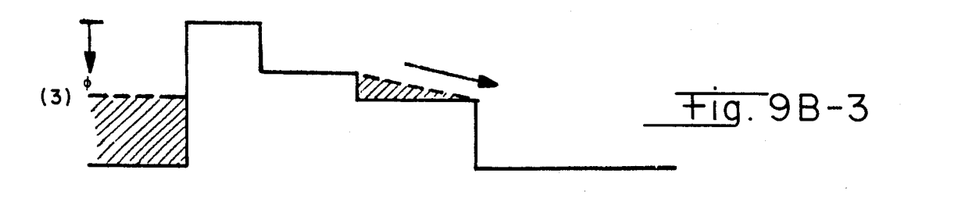

FIG. 9 in the portions 9A, 9B and 9C illustrate three aspects of both charge removal and the transparent propagation which is used when charge removal is not enabled. The CCD array structure in FIG. 9 represents one possible arrangement of the FIG. 8 elements joining the DCR1 and DCR2 electrodes. An observer viewing in cross-section from the left most side of the FIG. 8 CCD array would see the FIG. 8 portions attending the DCR1 and DCR2 electrodes in the relative relations shown in FIG. 9—the DCR electrodes on the left and joined on the right by the dark charge Parallel Transfer (DCPT), Fixed Gate (VFG), E clock ($\phi_E$) and N+ electrodes. Two DCR electrodes DCR1 and DCR2 in FIG. 9A are presumed to be stacked in the indicated DCR position; one of these, DCR1, is located above the drawing page and the other, DCR2, below the drawing page—in conformance with the serial arrangement shown in FIG. 8. The stacked two DCR electrodes are indicated simply as DCR in FIG. 9A.

The capacitor C shown in FIG. 9A represents the signal storage capability residing in the VFG region of the FIG. 9A CCD array circuitry and is further described subsequently herein. The P− region in FIG. 9A represents an ion implanted region which functions to establish the implanted barrier potential energy dam shown and described in FIG. 9B. The N+ region in FIG. 9A, referred to alternatively as a drain, provides a path by which charge not to be recirculated in the memory, i.e. dark charge, is removed from the FIG. 9A array.

Transparent propagation obtains in FIGS. 8 and 9 when the waveforms of FIG. 9C have the shape indicated by the dotted continuations marked with an asterisk (*). For transparent propagation, the Data Charge Parallel Transfer (DCPT) electrode continues low as a barrier while the Dark Charge Removal electrodes (DCR1 & DCR2) operate in the fashion of conventional forward propagating clocks.

Prior to a charge removal operation in the FIGS. 8 and 9 circuit array, a signal charge packet advances downstream in the conventional manner—through electrodes driven with the clock waveforms $\phi$ and $\phi A$, as shown in the lower portion of FIG. 9C and arrives at the electrode DCR1. If charge removal is enabled, the parallel transfer electrode (DCPT) is made attractive (for positive in the illustrated negative signal charge example) to facilitate charge flow out of the main recirculation loop and into a new physical direction, the direction of the VFG, $\phi E$ and N+ electrodes in the FIG. 8 representation of the array, a direction approximately perpendicular or orthogonal of the main recirculation loop flow path. This flow direction change is further assisted by the electrodes DCR1 and DCR2 being made repulsive (negative) and forcing the signal charge packet out of the channel area of the main recirculation loop as shown by the sequence (1) in FIG. 9C and by the flow indicated in FIG. 9B-1 of FIGS. 9B-1 through 9B-3. Parenthetically, it should be noted that the arrowed symbols at the left side of FIG. 9B indicate a negative correlation between potential energy and electric potential—this convention is used in order to preserve the flow of charge to flow of water analogy commonly used in potential energy diagrams. In summary, lower levels in FIG. 9B represent more positive potentials. FIG. 9 also follows the conventions described for FIG. 2 wherein vertical alignments between FIGS. 9A and 9B are meaningful, the sequence of electrode order in FIG. 9C corresponds to that in FIG. 8 and FIG. 9A, and signal flows are indicated in FIG. 9C by parenthetic numbers.

The diverted charge packet in FIG. 9A is intended to fill or flood the active channel electrode area associated with the electrodes DCPT and VFG, and is bounded by channel stops located on the sides of the FIG. 8 circuit and by the electrode labelled $\phi E$ in its barrier state.

In the sequence (2) of FIGS. 9B and 9C, the electrodes DCR have become attractive (positive) thereby drawing the charge packet back out of the VFG region except for the charge trapped behind the fixed implanted barrier $\Delta V$ shown in FIGS. 9B-1 and 9B-2. Since the overall electrode labelled VFG is biased by a low noise DC source, the repeatability of the charge trapped under VFG is favorable, i.e., approximately of the order of $(kTC)^{\frac{1}{2}}$ coulombs where k=Boltzman's constant; T=device absolute temperature, and C=active channel capacitance under the VFG electrode where charges are held, exclusive of the implanted barrier region.

In the sequence 3 in FIGS. 9B and 9C the original packet, now reduced by the amount of charge held back under the electrode VFG (i.e., $\Delta Q=(\Delta V)\cdot C$)—where $\Delta V$ and C are as indicated in FIG. 9, becomes confined under the DCR electrodes by the action of the DCPT electrode changing into the repulsive barrier (negative) state. This also isolates the charge $\Delta Q$, so that the positive $\phi E$ waveform (3) permits the charge $\Delta Q$ to dump out at the N+ drain, while simultaneously the signal charge packet resumes its normal propagation around the recirculation loop.

Charge subtraction or removal in the manner described bove can also be used in CCD input arrangements generally and in CCD input cells associated with infrared focal plane detectors.

It should be noted in FIG. 1 that the ordering of the analog charge packets in each of the stacks 100 and 102, along the path 152, and along the path 150 is somewhat unusual. Data received at the serial input path 146 are presumed organized in a first-to-last or 1 to N order and are transmitted in this order through the stack 100. Transfer from the stack 100 along the path 152, however, occurs in reverse order with the Nth data sample proceeding first between the stack 100 and the stack 102. The Nth sample is therefore received first in the data readout order at 122 in FIG. 1. Since a similar data order reversal also occurs in the stack 102, the original 1-to-N order is achieved again upon data serial transfer from the stack 102 output register 134. The data is received in this desired order at the input circuit 142 and is presented in this order from the NDRO circuit 140 as shown at 144.

Use of this data order reversing arrangement eliminates the need for additional serial transfers of the data in the closed-loop memory and contributes to the decreased power consumption and improved crosstalk performance realizable with the illustrated apparatus.

With the illustrated apparatus, for example, in a circulating memory which includes 23 segments, 10 stages per segment, and 9 stack columns 14,000 circulations of a given signal around the memory loop are possible before an 83 dB degradation of signal due to crosstalk occurs.

A conventional arrangement for achieving the circulating memory capability described herein would therefore fall short of the present invention apparatus in that in such a conventional arrangement, either a serial serpentine memory would be employed or alternately, registers separate and apart from the output and input registers 134 and 104 would be employed in achieving the serial transfer between stacks of the illustrated apparatus. Both these conventional arrangements are less desirable than the present apparatus from a cost and performance viewpoint.

While the apparatus and method herein described constitute a preferred embodiment of the invention, it is to be understood that the invention is not limited to this precise form of apparatus or method, and that changes may be made therein without departing from the scope of the invention, which is defined in the appended claims.

We claim:

1. Charge coupled device memory apparatus for circulating time segregated serial increments from an analog input signal stream interval, including pairings of serial signal increment data with dummy signal data generated according to a predetermined charge collecting algorithm, around a closed memory loop for repeated and delayed accesses of the interval data comprising:

first serial parallel serial charge coupled device cell array including first serial input register means for receiving said pairs of serial signal increments and associated charge collecting algorithm dummy signal in first to last ordered sequence, first serial output register means for outputting said pairs of serial signal increments and dummy signal in last to first ordered sequence and first register stack means for receiving said time segregated serial signal increment and dummy signal pairs in parallel form from said first serial input register, and for propagating said signal increments and dummy signals in parallel form between successive parallel stages in said first stack means and for parallel coupling said signal increments and dummy signals to said first serial output register;

second serial parallel serial charge coupled cell device array including second serial input register means for receiving said pairs of serial signal increments and associated charge collecting algorithm dummy signal in last to first ordered sequence, second serial output register means for outputting said pairs of serial signal increment and dummy signal in first to last ordered sequence and second register stack means for receiving said time segregated serial signal increment and dummy signal pairs in parallel form from said second serial input register, and for propagating said signal increments and dummy signals in parallel form between successive parallel stages in said second stack means and for parallel coupling said increments and dummy signals to said second serial output register;

parallel additive refresh circuit means including a plurality of additive refresh circuits periodically located in said first and second register stack means for combining each said dummy signal with the related signal increment for correcting charge transfer and crosstalk degradation of said signal increments in said charge coupled device cells;

first charge coupled device serial transmission means coupled between the output terminal of said first serial output register and the input terminal of said second serial input register for coupling serial data between said first and second stacks;

second charge coupled device serial transmission means coupled between the output terminal of said second serial output register and the input terminal of said first serial input register for closed-loop coupling of serial signals between said second and first stacks; and serial additive refresh means including additive refresh circuits located in said first and second charge coupled device serial transmission means for combining said dummy signals with the related signal increment in said pairs for correcting charge transfer and crosstalk degradation of said signal increments in said charge coupled device cells.

2. The apparatus of claim 1 wherein said second charge coupled device serial transmission means includes input signal receiving means for receiving said pairs of serial signal increments and associated charge collecting dummy signal from a source thereof into said memory apparatus.

3. The apparatus of claim 2 wherein said second charge coupled device serial transmission means includes non-destructive readout tap means for serially reading the time-segregated signal increments of said signal stream interval in first-to-last increment order to an output port of said memory apparatus during coupling of said serial data between said second and first stacks.

4. The apparatus of claim 3 wherein said first charge coupled device serial transmission means includes non-destructive readout tap means for serially reading the time-segregated signal increments of said signal stream interval in last-to-first increment order during coupling of said serial data between said first and second stacks.

5. The apparatus of claim 3 or claim 4 wherein said readout tap means further includes dark charge sensing means for comparing the dark charge level of said circulating signal increments with a predetermined dark charge level threshold.

6. The apparatus of claim 5 wherein said parallel and serial additive refresh circuits are capable of combining said dummy signal and said related signal increment according to the inverse of said predetermined algorithm.

7. The apparatus of claim 5 wherein said charge coupled device serial transmission means further includes dark charge subtraction means responsive to said dark charge sensing means for removing a constant value non-varying component of dark charge signal from each of said signal increments.

8. A method, usable in a charge coupled device array, for temporary storage and repeated serial accessing of a stream of analog signal data comprising the steps of:

segregating a finite sample of said analog data stream into periodic time increments each representable by an analog signal amplitude value;

collecting a number N of said signal amplitude values serially into a first-to-last ordered first group;

shifting said N signal first group periodically and in parallel form through a first stack plurality of charge coupled device storage locations;

assembling said shifted N signal first group serially into a last-to-first ordered second group of N signals;

incrementing said N signal second group periodically and in parallel form through a second stack plurality of charge coupled device storage locations;

refreshing each of said signals periodically during said shifting and said incrementing, the selected frequency of refreshing being responsive to the degree of degradation expected during said shifting and incrementing in said charge coupled device storage locations;

repeating said steps of collecting, shifting, assembling and incrementing a predetermined number of times in closed-loop fashion for each successive N signal group in said sample;

accessing each said N signal group serially during one of said collecting and assembling steps; and selecting a new finite sample of said analog data stream following said predetermined number of repetitions.

9. The method of claim 8 wherein said shifting and incrementing steps also include refreshing for charge transfer degradation during accumulation of said time increment signals in said storage locations.

* * * * *

UNITED STATES PATENT AND TRADEMARK OFFICE
CERTIFICATE OF CORRECTION

PATENT NO. : 4,675,847

DATED : June 23, 1987

INVENTOR(S) : Jack Birnbaum et al

It is certified that error appears in the above-identified patent and that said Letters Patent is hereby corrected as shown below:

Col 4, line 23, "integrated" to read -- integration --.

Col 5, line 40, "abovementioned" should read -- above-mentioned --.

Col 5, line 52, "idential" should be --identical--.

Col 7, line 35, equation "$(1/10^{-4})$" should be --$((1/10^{-4})$--.

Col 9, line 62, "samle" should be --sample--.

Col 10, line 56, "of" should be --for--.

Col 10, line 61, "$\phi 1$ and $\phi 1$" should be --$\overline{\phi 1}$ and $\phi 1$--.

Col 10, line 64, "$\phi 1$" should --$\overline{\phi 1}$--.

Col 10, line 67, "$\phi 1$ and $\phi 1$" should be --$\phi 1$ and $\overline{\phi 1}$--.

Col 14, line 62, "energy" should be --every--.

Col 15, line 59, "$\phi A$" should be --$\overline{\phi A}$--.

Col 16, line 51, "bove" should be --above--.

Signed and Sealed this

Twelfth Day of April, 1988

Attest:

DONALD J. QUIGG

Attesting Officer

Commissioner of Patents and Trademarks